United States Patent
Coq et al.

(10) Patent No.: US 9,164,142 B2
(45) Date of Patent: Oct. 20, 2015

(54) TESTING ELECTRONIC COMPONENTS ON ELECTRONIC ASSEMBLIES WITH LARGE THERMAL MASS

(71) Applicant: International Business Machines Corporation, Armonk, NY (US)

(72) Inventors: Marc Coq, Hopewell Junction, NY (US); Richard J. Fishbune, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 407 days.

(21) Appl. No.: 13/671,477

(22) Filed: Nov. 7, 2012

(65) Prior Publication Data

US 2014/0125365 A1    May 8, 2014

(51) Int. Cl.
 *G01R 31/00* (2006.01)
 *G01R 31/28* (2006.01)
 *G01R 1/04* (2006.01)

(52) U.S. Cl.
 CPC ........ *G01R 31/2817* (2013.01); *G01R 31/2862* (2013.01); *G01R 1/0458* (2013.01); *G01R 31/003* (2013.01)

(58) Field of Classification Search
 CPC .................................................. G01R 1/0458
 USPC ........................ 324/537–750.14; 702/132, 57
 See application file for complete search history.

(56) References Cited

U.S. PATENT DOCUMENTS

| | | | |
|---|---|---|---|
| 5,744,975 A | 4/1998 | Notohardjono et al. | 324/750.05 |
| 6,900,650 B1 * | 5/2005 | Sheng et al. | 324/750.07 |
| 2002/0011836 A1 * | 1/2002 | Ito et al. | 324/158.1 |
| 2003/0217316 A1 | 11/2003 | Giesel et al. | 714/742 |
| 2006/0103404 A1 * | 5/2006 | Desai et al. | 324/760 |
| 2007/0262769 A1 * | 11/2007 | Kim | 324/158.1 |
| 2008/0297167 A1 | 12/2008 | Possa | 324/537 |
| 2009/0314607 A1 | 12/2009 | Karino et al. | 198/341.01 |
| 2013/0288610 A1 * | 10/2013 | Toh et al. | 455/67.14 |

FOREIGN PATENT DOCUMENTS

| | | | |
|---|---|---|---|
| CN | 201607178 U | 10/2010 | F42B 35/00 |
| GB | 2336914 A | 11/1999 | G01N 3/18 |
| TW | 201044520 A | 12/2010 | G01K 1/14 |

OTHER PUBLICATIONS

Qi et al, "No-fault-found and intermittent failures in electronic products," Microelectronics Reliability 48, Apr. 2008, pp. 663-674.

* cited by examiner

*Primary Examiner* — Huy Q Phan
*Assistant Examiner* — Dustin Dickinson
(74) *Attorney, Agent, or Firm* — Van Leeuwen & Van Leeuwen; Damion C. Josephs

(57) ABSTRACT

An approach is provided in which a system under test is subjected to thermal cycling that include transferring the system under test between two different environments that generate two different ambient temperatures. In turn, a test system tests the electronic assembly in response to the electronic assembly being subjected to the thermal cycles.

17 Claims, 7 Drawing Sheets

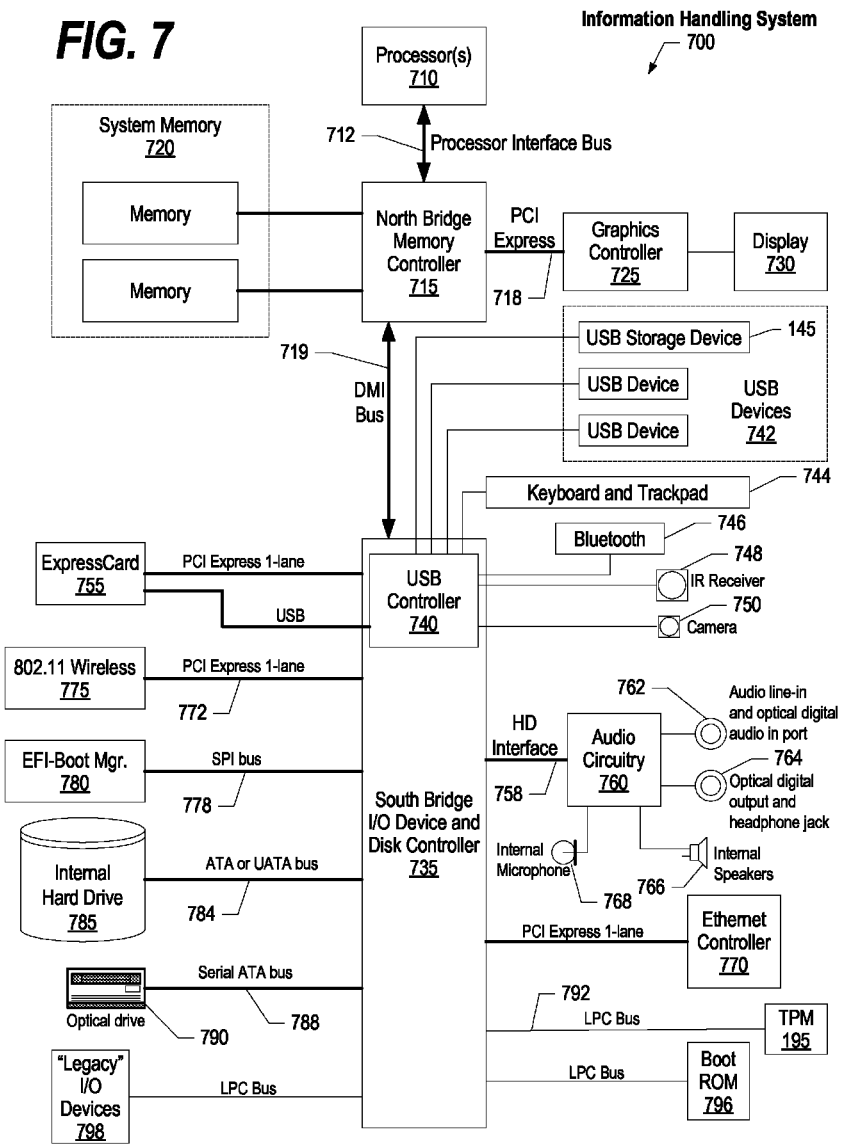

TESTING ELECTRONIC COMPONENTS ON ELECTRONIC ASSEMBLIES WITH LARGE THERMAL MASS

BACKGROUND

The present disclosure relates to testing electronic components on electronic assemblies with large thermal mass. More particularly, the present disclosure relates to thermally stressing electronic assemblies by transferring the electronic assemblies between different environments that produce different ambient temperatures.

A business may employ sophisticated testing methods and techniques in order to reduce a product's time to market. Many of today's products are capable of operating under environmental extremes and for thousands of hours without failure. Accelerated testing allows a business to collect an increased amount of information within a given time period by subjecting a product to severe test environments compared to traditional test methods. These severe test environments may include higher temperatures, higher vibration levels, and/or an increased amount of temperature cycling.

BRIEF SUMMARY

According to one embodiment of the present disclosure, an approach is provided in which a system under test is subjected to thermal cycling that include transferring the system under test between two different environments that generate two different ambient temperatures. In turn, a test system tests the electronic assembly in response to the electronic assembly being subjected to the thermal cycles.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 7 is a block diagram of a data processing system in which the methods described herein can be implemented

DETAILED DESCRIPTION

Figure 1:
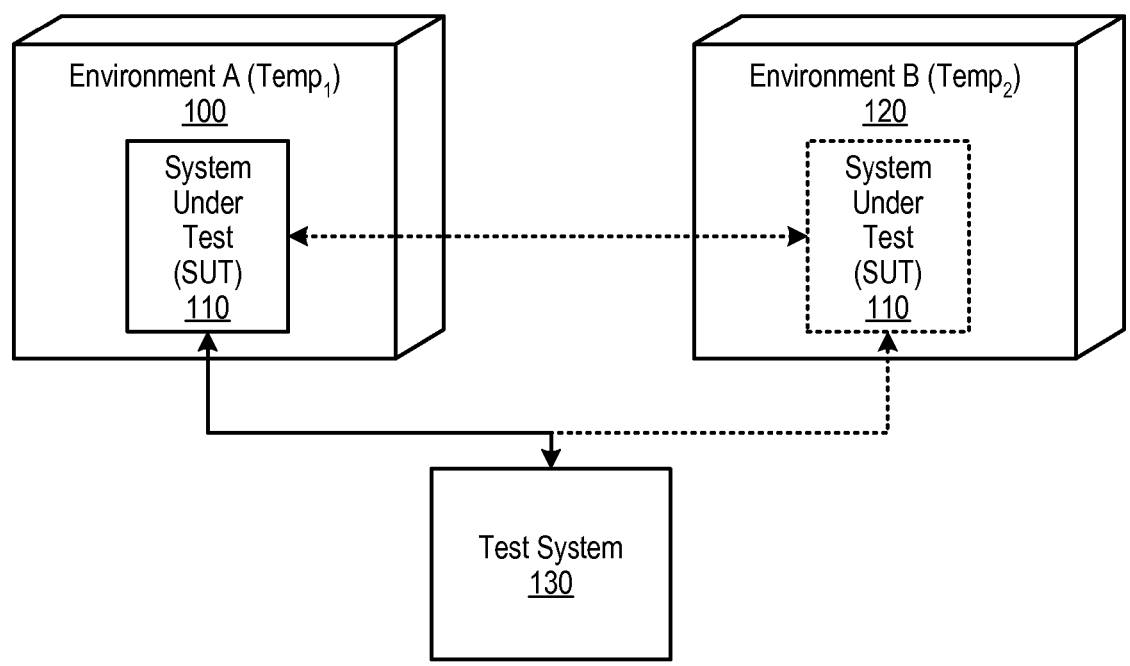
FIG. 1 is a diagram showing a system under test subjected to accelerated thermal cycling (ATC) by transferring between two environments with different ambient temperatures.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The following detailed description will generally follow the summary of the disclosure, as set forth above, further explaining and expanding the definitions of the various aspects and embodiments of the disclosure as necessary.

FIG. 1 is a diagram showing a system under test subjected to accelerated thermal cycling (ATC) by transferring between two environments with different ambient temperatures. System under test (SUT) 110, in one embodiment, may be a large electronic assembly compared to traditional environmental chambers. For example, SUT 110 may be a large server system. As such, SUT 110 may include a substantial amount of mass that, in turn, may require an increased amount of time to reach accelerated thermal cycling target temperatures.

This disclosure reduces the overall amount of time for SUT 110 to reach the accelerated thermal cycling target temperatures by maintaining temperatures within two environments (environment A 100 and environment B 120) and transferring SUT 110 between the environments. As a result, ATC temperature transition times do not require the mass of the environment itself (e.g., chamber walls) to rise or fall in temperature, but rather just the electronic assembly (see FIG. 5 and corresponding text for further details).

FIG. 1 shows environment A 100 and environment B 120. As discussed herein, environments may be enclosures such as a thermal oven, an open test area, or other location that is capable of producing a steady ambient temperature. For example, environment A 100 may be on a test floor at temperature 1 (e.g., 25° C.) and environment B 120 may be in an oven that maintains a temperature 2 at 100° C.

In one embodiment, when the SUT 110 is not able to reach a particular target temperature (or not in a given amount of time), test system 130 may power on SUT 110 while SUT 110 is placed in one of the environments in order to raise the surface temperature of SUT 110 to the target temperature. Likewise, test system 130 may power off SUT 110 when trying to reach the lower target temperature. For example, if SUT 110 requires a surface temperature of 150° C. as an acceptable accelerated thermal cycle target temperature and environment B 120 is only able to reach 130° C., test system 130 may power on SUT 110 for a certain amount of time while located in environment B 120 in order to raise the surface temperature of SUT 110 to the target temperature (see FIG. 4 and corresponding text for further details).

Figure 6:
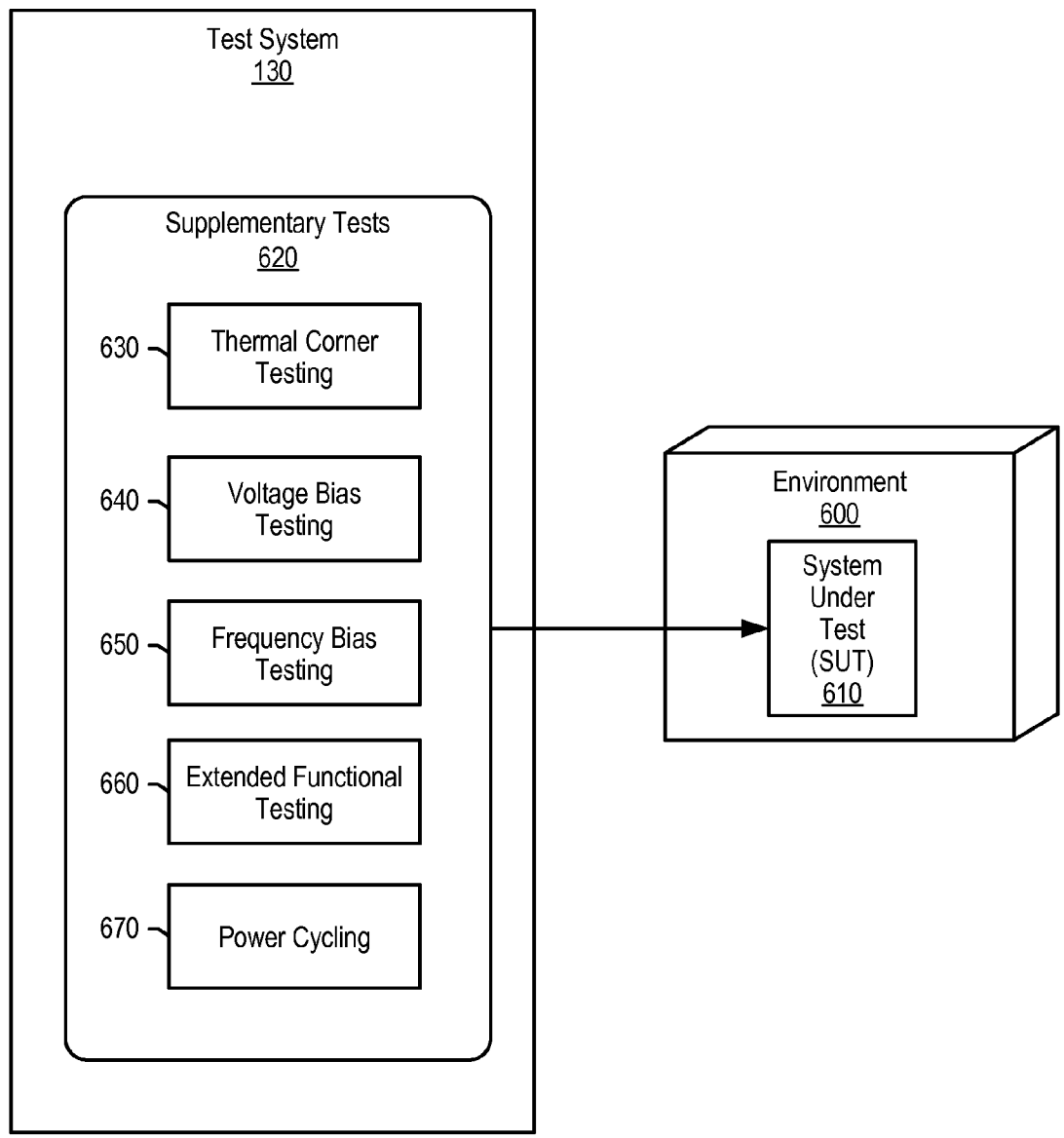
FIG. 6 is a diagram showing various supplementary tests for a system under test.

In another embodiment, test system 130 may perform other tests during thermal cycle operations, such as voltage bias testing and frequency bias testing (see FIG. 6 and corresponding text for further details).

Figure 2:
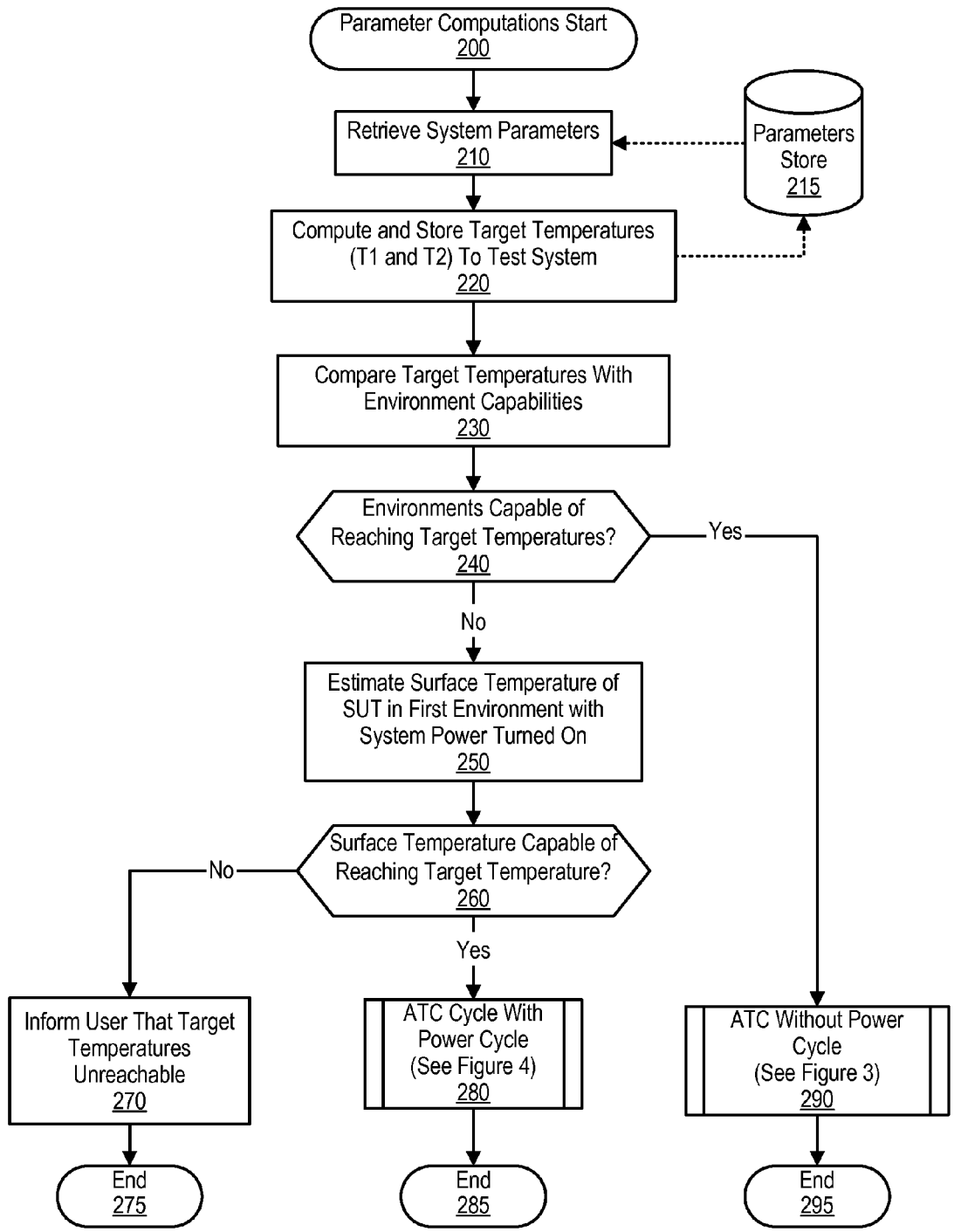
FIG. 2 is a flowchart showing steps taken in computing accelerated thermal cycle target temperatures and testing an electronic assembly according to the accelerated thermal cycle (ATC) target temperatures.

FIG. 2 is a flowchart showing steps taken in computing accelerated thermal cycle target temperatures and testing an electronic assembly according to the accelerated thermal cycle (ATC) target temperatures. Processing commences at 200, whereupon processing retrieves system parameters of the electronic assembly from parameters store 215 at step 210. For example, the system parameters may include component temperature ranges and/or electronic assembly operating/storage temperature ranges.

At step 220, processing computes target temperatures to test the electronic assembly (e.g., a low target temperature and a high target temperature) and stores the target temperatures in parameters store 215. The ATC target temperatures are based upon the system parameters retrieved in step 210.

In one embodiment, target temperatures may be computed by analyzing material properties and component ratings included in the SUT, such as TCE (temperature coefficient of expansion), glass transition temperatures, material upper temperature ratings, and material lower temperature ratings. In this embodiment, the material properties and component properties may bound the possible target temperatures and, the wider the gap between low target temperature and high target temperature, the fewer ATC cycles may be required to screen the SUT. As those skilled in the art can appreciate, equations such as the Coffin-Manson equation may be used to predict the effectiveness of a given screen and establish an appropriate number of cycles for a given temperature span.

Next, processing compares the target temperatures with environment capabilities at step 230, and a determination is made as to whether each of the environments (e.g., thermal chamber) are capable of reaching the target temperatures (decision 240). If so, decision 240 branches to the "Yes" branch, whereupon the electronic assembly is subject to accelerated thermal cycling between two environments (pre-defined process block 290, see FIG. 3 and corresponding text for further details). Processing ends at 295.

On the other hand, if the environments are not capable of reaching the temperature boundaries, decision 240 branches to the "No" branch, whereupon processing estimates the surface temperature of the electronic assembly when powered on and located in one of the environments (step 250). For example, the electronic assembly may increase in temperature by 25° C. when powered on and, in turn reach a surface temperature that equals the target temperature.

A determination is made as to whether the heat generated by the electronic assembly when turned on combined with the environment capabilities reach the target temperature (decision 260). If so, decision 260 branches to the "Yes" branch, whereupon the electronic assembly is subject to power cycling and accelerated thermal cycling between two environments (pre-defined process block 280, see FIG. 4 and corresponding text for further details). Processing ends at 285.

On the other hand, if the heat generated by the electronic assembly when turned on combined with the environment capabilities does not reach the target temperature, decision 260 branches to the "No" branch, whereupon processing informs the user that the electronic assembly may not be thermally stressed using existing environmental capabilities (decision 270). In one embodiment, processing records the actual temperature reached by the SUT and warns user that the thermal stress may not be as severe as desired. In this embodiment, the user decides whether the testing is acceptable, such as by using the Coffin-Manson equation. Processing ends at 275.

Figure 3:
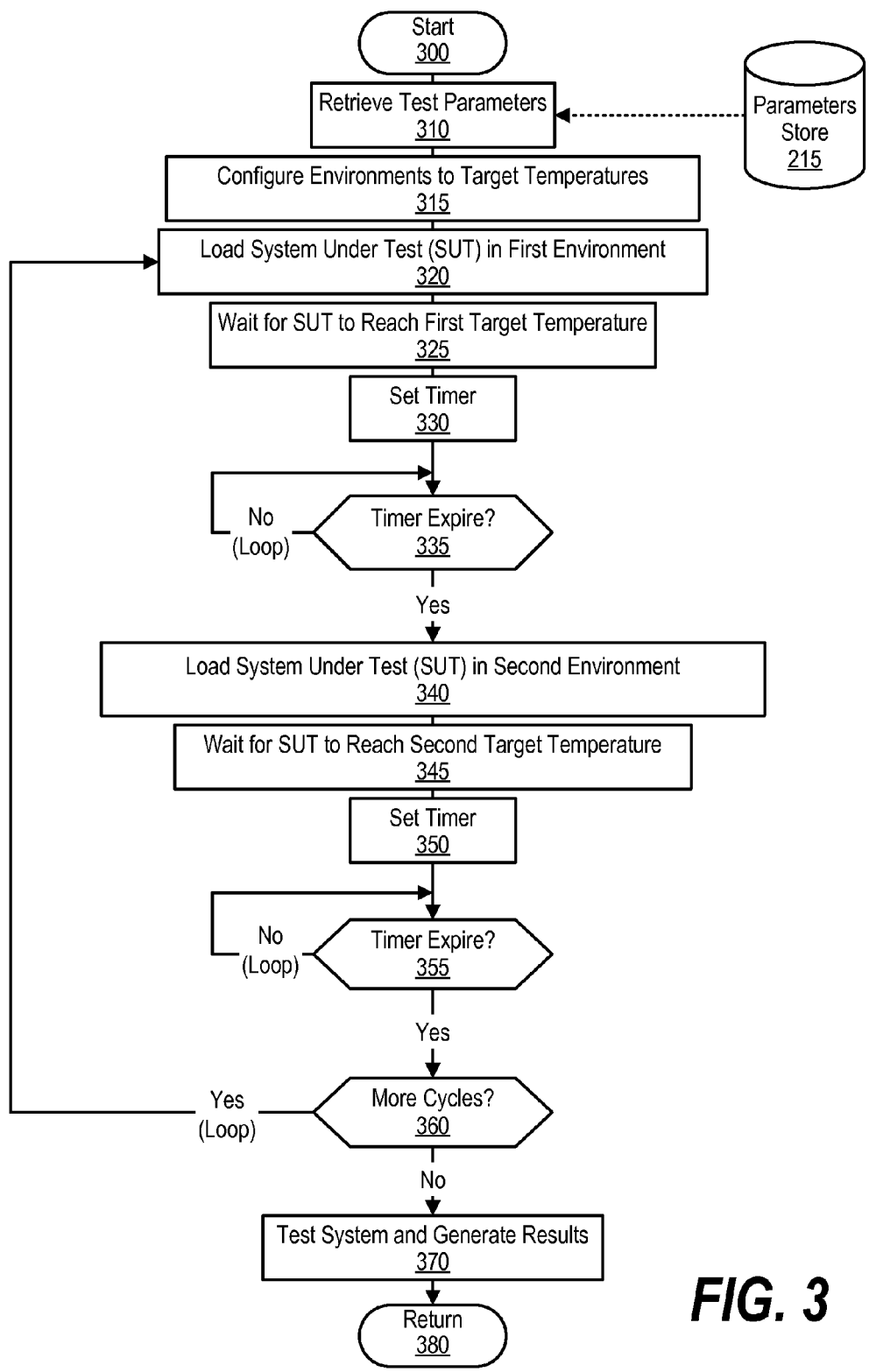
FIG. 3 is a flowchart showing steps taken in thermally stressing an electronic assembly and subsequently testing the electronic assembly.

FIG. 3 is a flowchart showing steps taken in thermally stressing an electronic assembly and subsequently testing the electronic assembly.

Processing commences at 300, whereupon processing retrieves target temperatures from parameters store 215 at step 310. At step 315, the environments are configured to generate the target temperatures. For example, one target temperature may be 25° C., which corresponds to a test floor room, and the other temperature boundary may be 100° C., which corresponds to configuring a thermal chamber to 100° C.

At step 320, the SUT is loaded into the first environment and, at step 325, test system 130 monitors the SUT's surface temperature and waits for the surface temperature to reach the first target temperature.

Test system 130 sets a timer at step 330 to an amount equal to a time period to keep the SUT in the first environment, and processing monitors the time accordingly (decision 335) by looping to decision 335's "No" branch. When the timer expires, decision 335 branches to the "Yes" branch, whereupon the SUT is removed from the first environment and placed in the second environment (step 340).

At step 345, test system 130 monitors the SUT's surface temperature and waits for the surface temperature to reach the second target temperature. In turn, test system 130 sets a timer at step 350 to an amount equal to a time period to keep the SUT in the second environment. Test system 130 monitors the time accordingly (decision 355) by looping to decision 335's "No" branch. When the timer expires, decision 355 branches to the "Yes" branch, whereupon a determination is made as to whether the SUT should be subjected to additional thermal cycles (decision 360). If the SUT should be subjected to additional thermal cycles, decision 360 branches to the "Yes" branch, which instructs a user to remove the SUT from the second environment and place the SUT in the first environment. This looping continues until the SUT is finished with accelerated thermal cycling, at which point decision 360 branches to the "No" branch.

At step 370, test system 130 tests the electronic assembly (e.g., functional tests) and generates results. Processing returns at 380.

Figure 4:
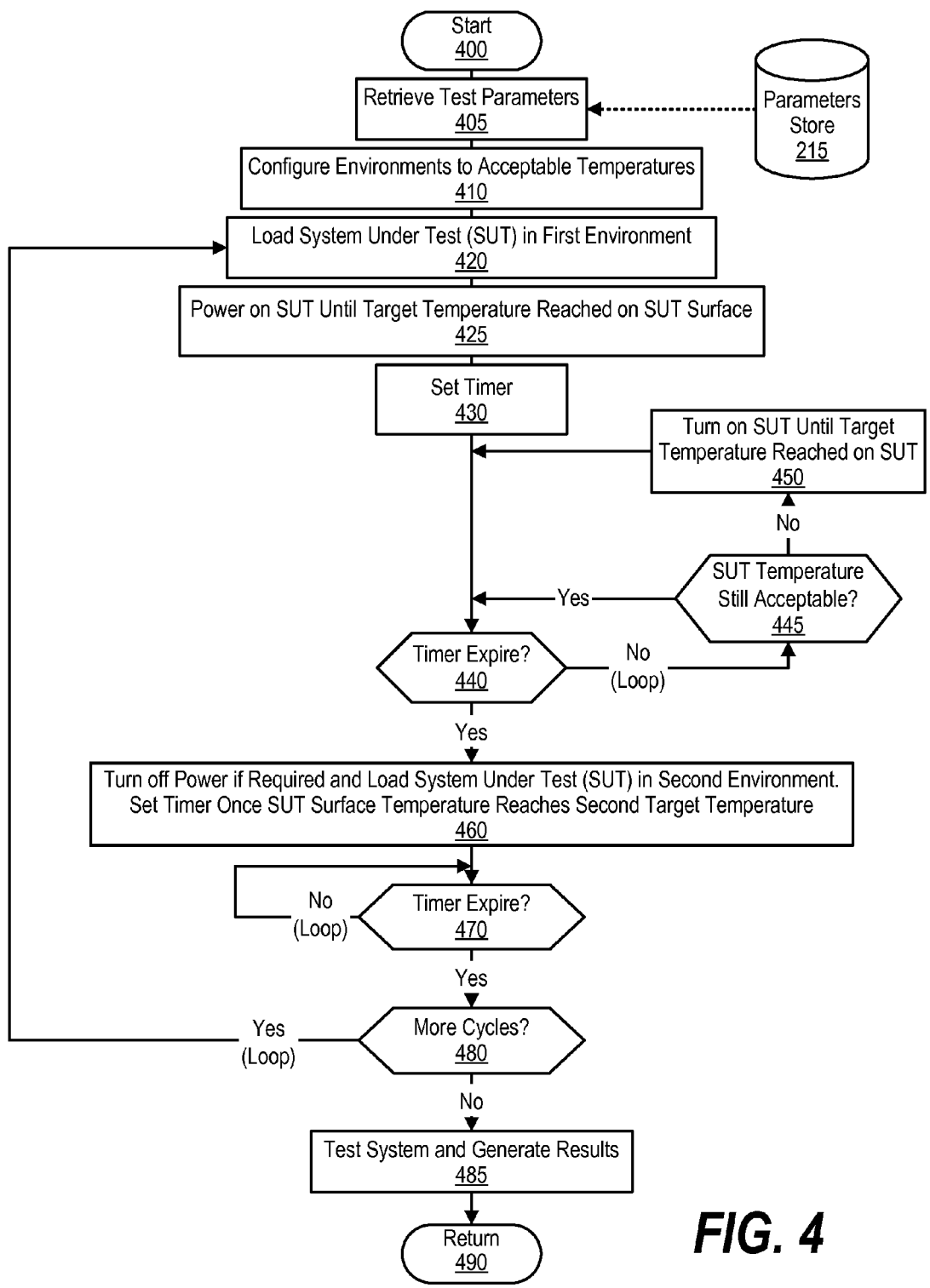
FIG. 4 is a flowchart showing steps taken in power cycling an electronic assembly during accelerated thermal cycling and subsequently testing the electronic assembly.

FIG. 4 is a flowchart showing steps taken in power cycling an electronic assembly during accelerated thermal cycling and subsequently testing the electronic assembly. FIG. 4 is similar to FIG. 3 with the exception that test system 130 power cycles the SUT in order to increase the SUT's surface temperature and compensate for a test environment's capabilities.

Processing commences at 400, whereupon test system 130 retrieves target temperatures from parameters store 215 at step 405. At step 410, processing configures the environment or environments to acceptable temperatures. For example, if a first target temperature is 150° C. and the first environment is a chamber capable of reaching 120° C., then the first chamber is configured at 120° C.

At step 420, the SUT is loaded into the first environment and, at step 425, test system 130 powers on the SUT until the SUT's surface temperature reaches the first target temperature. Test system 130 sets a timer at step 430 to a time period to keep the SUT in the first environment, and processing monitors the time accordingly (decision 440). If the time has not expired, decision 440 branches to the "No" branch, whereupon a determination is made as to whether the SUT surface temperature is still at the first target temperature (decision 445). If so, decision 445 branches to the "Yes" branch, whereupon processing continues to monitor the timer.

On the other hand, if the SUT surface temperature has decreased to an unacceptable level, decision 445 branches to the "No" branch, whereupon processing turns on the SUT until the SUT surface temperature reaches the first target temperature (step 450).

When the timer expires, decision 440 branches to the "Yes" branch, whereupon the SUT is removed from the first environment (power is turned off if required) and placed in the second environment (step 460). Test system 130 monitors the SUT's surface temperature and sets a timer once the surface temperature reaches the second target temperature.

Test system 130 monitors the timer accordingly (decision 470) and loops through decision 470's "No" branch. When the timer expires, decision 470 branches to the "Yes" branch, whereupon a determination is made as to whether the SUT should be subjected to additional accelerated thermal cycles (decision 480). If the SUT should be subjected to additional thermal cycles, decision 480 branches to the "Yes" branch, which instructs a user to remove the SUT from the second environment and place in the first environment. This looping continues until the SUT is finished with thermal cycles, at which point decision 480 branches to the "No" branch.

At step 485, test system 130 tests the electronic assembly (e.g., functional tests) and generates results. Processing returns at 490.

Figure 5:
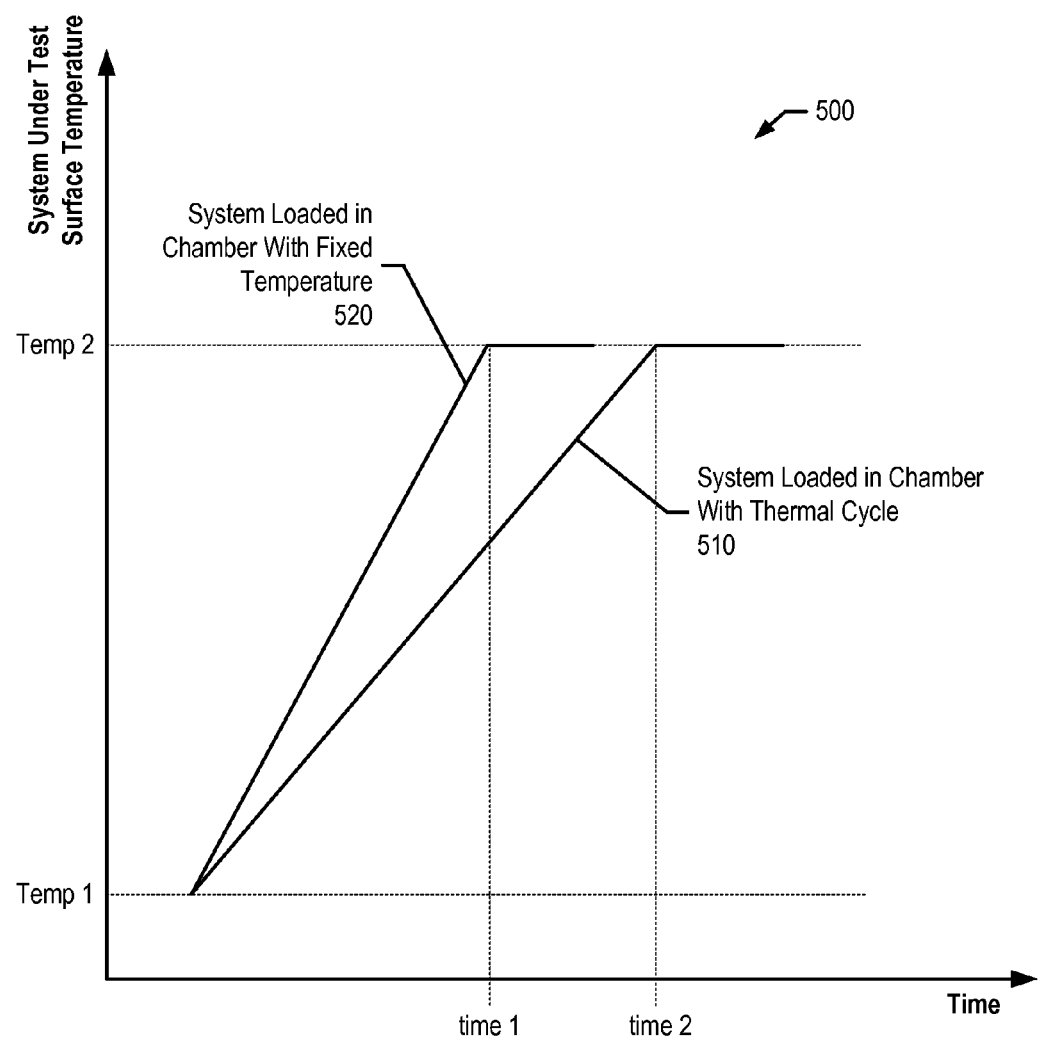
FIG. 5 is a diagram showing a relative rate of temperature increase of an SUT's surface temperature.

FIG. 5 is a diagram showing a relative rate of temperature increase of an SUT's surface temperature. Graph 500 illustrates an SUT's surface temperature increase from a low target temperature (temp 1) to a high target temperature (temp 2). Plot 520 shows an embodiment where the SUT is placed in an environment that has an ambient temperature at the high target temperature, and plot 510 shows an embodiment where the environment's ambient temperature starts at temp 1 and increases to temp 2.

Since the amount of mass to change temperature is less when the environment maintains the high target temperature, plot 520 shows that the amount of time for the SUT's surface temperature to reach Temp 2 is less (time 1) compared with the amount of time the SUT's surface temperature reaches Temp 2 when the environment's mass is also required to change temperatures.

FIG. 6 is a diagram showing various supplementary tests for a system under test. This disclosure allows test system 130 to perform several tests when the SUT undergoes accelerated thermal cycling. Supplementary tests 620 include tests 630-670. As those skilled in the art can appreciate, more or less tests may be performed on SUT 610 than what supplementary tests 620 include.

Thermal corner testing 630 includes testing SUT 610 based on its system specifications. Voltage bias testing 640 may adjust the input voltage of SUT 610 during ATC testing. Frequency bias testing 650 may adjust the input frequency of SUT 610 during ATC testing. Test system 130 may perform extended functional testing 660 (e.g., extended burn-in tests), as well as power cycling 670 as discussed in FIG. 4.

FIG. 7 illustrates information handling system 700, which is a simplified example of a computer system capable of performing the computing operations described herein. Information handling system 700 includes one or more processors 710 coupled to processor interface bus 712. Processor interface bus 712 connects processors 710 to Northbridge 715, which is also known as the Memory Controller Hub (MCH). Northbridge 715 connects to system memory 720 and provides a means for processor(s) 710 to access the system memory. Graphics controller 725 also connects to Northbridge 715. In one embodiment, PCI Express bus 718 connects Northbridge 715 to graphics controller 725. Graphics controller 725 connects to display device 730, such as a computer monitor.

Northbridge 715 and Southbridge 735 connect to each other using bus 719. In one embodiment, the bus is a Direct Media Interface (DMI) bus that transfers data at high speeds in each direction between Northbridge 715 and Southbridge 735. In another embodiment, a Peripheral Component Interconnect (PCI) bus connects the Northbridge and the Southbridge. Southbridge 735, also known as the I/O Controller Hub (ICH) is a chip that generally implements capabilities that operate at slower speeds than the capabilities provided by the Northbridge. Southbridge 735 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 796 and "legacy" I/O devices (using a "super I/O" chip). The "legacy" I/O devices (798) can include, for example, serial and parallel ports, keyboard, mouse, and/or a floppy disk controller. The LPC bus also connects Southbridge 735 to Trusted Platform Module (TPM) 795. Other components often included in Southbridge 735 include a Direct Memory Access (DMA) controller, a Programmable Interrupt Controller (PIC), and a storage device controller, which connects Southbridge 735 to nonvolatile storage device 785, such as a hard disk drive, using bus 784.

ExpressCard 755 is a slot that connects hot-pluggable devices to the information handling system. ExpressCard 755 supports both PCI Express and USB connectivity as it connects to Southbridge 735 using both the Universal Serial Bus (USB) the PCI Express bus. Southbridge 735 includes USB Controller 740 that provides USB connectivity to devices that connect to the USB. These devices include webcam (camera) 750, infrared (IR) receiver 748, keyboard and trackpad 744, and Bluetooth device 746, which provides for wireless personal area networks (PANs). USB Controller 740 also provides USB connectivity to other miscellaneous USB connected devices 742, such as a mouse, removable nonvolatile storage device 745, modems, network cards, ISDN connectors, fax, printers, USB hubs, and many other types of USB connected devices. While removable nonvolatile storage device 745 is shown as a USB-connected device, removable nonvolatile storage device 745 could be connected using a different interface, such as a Firewire interface, etcetera.

Wireless Local Area Network (LAN) device 775 connects to Southbridge 735 via the PCI or PCI Express bus 772. LAN device 775 typically implements one of the IEEE 802.11 standards of over-the-air modulation techniques that all use the same protocol to wirelessly communicate between information handling system 700 and another computer system or device. Optical storage device 790 connects to Southbridge 735 using Serial ATA (SATA) bus 788. Serial ATA adapters and devices communicate over a high-speed serial link. The Serial ATA bus also connects Southbridge 735 to other forms of storage devices, such as hard disk drives. Audio circuitry 760, such as a sound card, connects to Southbridge 735 via bus 758. Audio circuitry 760 also provides functionality such as audio line-in and optical digital audio in port 762, optical digital output and headphone jack 764, internal speakers 766, and internal microphone 768. Ethernet controller 770 connects to Southbridge 735 using a bus, such as the PCI or PCI Express bus. Ethernet controller 770 connects information handling system 700 to a computer network, such as a Local Area Network (LAN), the Internet, and other public and private computer networks.

While FIG. 7 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method for testing an electronic assembly, the method comprising:
    computing a first target temperature of the electronic assembly based upon one or more system parameters;
    in response to determining that a first environment is not capable of generating the first target temperature, determining that turning on power to the electronic assembly while the electronic assembly is in the first environment results in the surface temperature of the electronic assembly reaching the first target temperature;
    subjecting the electronic assembly to one or more thermal cycles, wherein each one of the thermal cycles comprises:
        placing the electronic assembly in the first environment with a first ambient temperature for a first time period;
        turning on power to the electronic assembly at least one time during the first time period when the surface temperature of the electronic assembly falls below the first target temperature;
        removing the electronic assembly from the first environment in response to the first time period expiring; and
        placing the electronic assembly in a second environment with a second ambient temperature for a second time period, wherein the second environment is at a different location than the first environment and the second ambient temperature is different than the first ambient temperature; and
    testing the electronic assembly, by one or more processors, in response to the electronic assembly being subjected to one or more thermal cycles.

2. The method of claim 1 further comprising:
    functionally testing of the electronic assembly when the electronic assembly is placed in the second environment.

3. The method of claim 1 wherein the first environment is selected from the group consisting of an enclosed thermal oven and an unenclosed room.

4. The method of claim 1 wherein the electronic assembly comprises a plurality of printed circuit boards.

5. The method of claim 1 wherein:
    the first ambient temperature is within a first temperature range;
    the second ambient temperature is within a second temperature range; and
    the first temperature range does not overlap the second temperature range.

6. A product made by a method comprising:
    computing a first target temperature of the electronic assembly based upon one or more system parameters;
    in response to determining that a first environment is not capable of generating the first target temperature, determining that turning on power to the electronic assembly while the electronic assembly is in the first environment results in the surface temperature of the electronic assembly reaching the first target temperature;
    subjecting the electronic assembly to one or more thermal cycles, wherein each one of the thermal cycles comprises:
        placing the electronic assembly in the first environment with a first ambient temperature for a first time period;
        turning on power to the electronic assembly at least one time during the first time period when the surface temperature of the electronic assembly falls below the first target temperature;
        removing the electronic assembly from the first environment in response to the first time period expiring; and
        placing the electronic assembly in a second environment with a second ambient temperature for a second time period, wherein the second environment is at a different location than the first environment and the second ambient temperature is different than the first ambient temperature; and
    testing the electronic assembly, by one or more processors, in response to the electronic assembly being subjected to one or more thermal cycles.

7. The product of claim 6 wherein the method further comprises:
    functionally testing of the electronic assembly when the electronic assembly is placed in the second environment.

8. The product of claim 6 wherein the first environment is selected from the group consisting of an enclosed thermal oven and an unenclosed room.

9. The product of claim 6 wherein the electronic assembly comprises a plurality of printed circuit boards.

10. The product of claim 6 wherein:
    the first ambient temperature is within a first temperature range;
    the second ambient temperature is within a second temperature range; and
    the first temperature range does not overlap the second temperature range.

11. A method comprising:
    retrieving, by one or more processors, one or more system parameters that correspond to an electronic assembly;
    computing, by one or more of the processors, a first target temperature and a second target temperature based upon the one or more system parameters;
    determining, by one or more of the processors, whether a first environment is capable of generating a first ambient temperature that corresponds to the first target temperature;
    in response to determining that the first environment is not capable of generating the first target temperature, determining that turning on power to the electronic assembly while the electronic assembly is in the first environment results in the surface temperature of the electronic assembly reaching the first target temperature;

determining, by one or more of the processors, whether a second environment is capable of generating a second ambient temperature that corresponds to the second target temperature, the second environment in a different location than the first environment;

in response to determining that the first environment with the electronic assembly turned on and the second environment are capable of generating the first ambient temperature and the second ambient temperature corresponding to the first target temperature and the second target temperature, respectively, configuring the first environment to operate at the first ambient temperature and configuring the second environment to operate at the second ambient temperature.

12. The method of claim 11 further comprising:

placing the electronic assembly in the first environment for a first time period;

removing the electronic assembly from the first environment in response to the first time period expiring;

placing the electronic assembly in the second environment for a second time period; and testing the electronic assembly in response to the second time period expiring.

13. The method of claim 11 further comprising:

generating an error message in response to the surface temperature of the electronic assembly failing to reach the first target temperature with the power turned on to the electronic assembly.

14. The method of claim 12 wherein the testing is selected from the group consisting of functional testing, thermal corner testing, voltage bias testing, frequency bias testing and extended functional testing.

15. The method of claim 11 wherein the first environment is selected from the group consisting of an enclosed thermal oven and an unenclosed room.

16. The method of claim 11 wherein the electronic assembly comprises a plurality of printed circuit boards.

17. The method of claim 11 wherein:

the first ambient temperature is within a first temperature range;

the second ambient temperature is within a second temperature range; and the first temperature range does not overlap the second temperature range.

* * * * *